(12) United States Patent
Van De Logt et al.

(10) Patent No.: US 7,409,612 B2
(45) Date of Patent: Aug. 5, 2008

(54) TESTING OF INTEGRATED CIRCUITS

(75) Inventors: Leon Maria Albertus Van De Logt, Eindhoven (NL); Thomas Franciscus Waayers, Eindhoven (NL); Frank Van Der Heyden, Eindhoven (NL)

(73) Assignee: NXP B.V., Eindhoven (NL)

( * ) Notice: Subject to any disclaimer, the term of this patent is extended or adjusted under 35 U.S.C. 154(b) by 140 days.

(21) Appl. No.: 10/545,121

(22) PCT Filed: Jan. 28, 2004

(86) PCT No.: PCT/IB2004/050057

§ 371 (c)(1),
(2), (4) Date: Aug. 9, 2005

(87) PCT Pub. No.: WO2004/070395

PCT Pub. Date: Aug. 19, 2004

(65) Prior Publication Data

US 2006/0100810 A1  May 11, 2006

(30) Foreign Application Priority Data

Feb. 10, 2003 (EP) ................................. 03075382
Jul. 30, 2003 (EP) ................................. 03102367

(51) Int. Cl.
*G01R 31/28* (2006.01)
*G01R 31/26* (2006.01)

(52) U.S. Cl. ...................... 714/727; 324/765

(58) Field of Classification Search .......... 714/726–729
See application file for complete search history.

(56) References Cited

U.S. PATENT DOCUMENTS

| 6,343,358 B1 * | 1/2002 | Jaggar et al. ................. 712/227 |
| 6,862,705 B1 * | 3/2005 | Nesbitt et al. ................ 714/729 |
| 6,886,122 B1 * | 4/2005 | Barthel ........................ 714/727 |
| 6,961,884 B1 * | 11/2005 | Draper ........................ 714/726 |
| 7,000,163 B1 * | 2/2006 | Dirks et al. .................. 714/727 |

OTHER PUBLICATIONS

Vranken H et al: "Enhanced Reduced Pin-Count Test for Full-Scan Design" ITC International Test Conference, vol. 18, No. 2, Oct. 30, 2001 pp. 738-474.

* cited by examiner

*Primary Examiner*—Cynthia Britt
(74) *Attorney, Agent, or Firm*—Peter Zawilski

(57) ABSTRACT

An integrated circuit with a test interface contains a boundary scan chain with cells (14) coupled between a test data input (TDI) and output (TDO) in a shift register structure. Each cell (14) is also coupled between a respective one of the terminals (16) and the core circuit (10). A test control circuit (TAP_C) supports an instruction to switch the boundary scan chain to a mode in which mode selectable first ones of the cells (14) transport data serially along the boundary scan chain while selectable second ones of the cells (14) write or read data that has been or will be transported through the first ones of the cells (14) in the further mode to or from the terminals (16) from or to the scan chain.

23 Claims, 5 Drawing Sheets

TESTING OF INTEGRATED CIRCUITS

Figure 1:
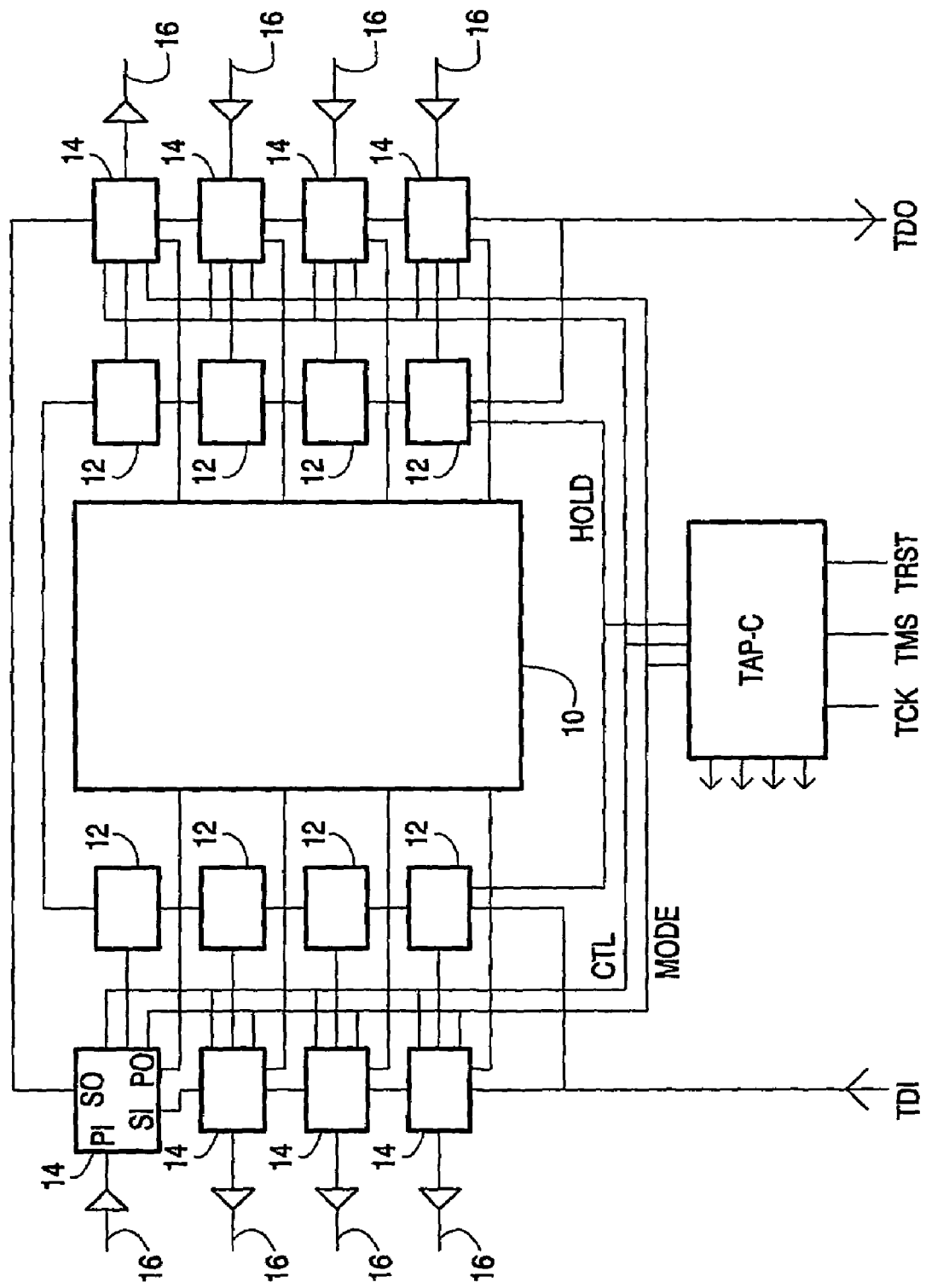

The invention relates to integrated circuits, and in particular to integrated circuits with a test interface with a boundary scan path, such as the test interface defined by the IEEE1149.1 standard.

The IEEE1149.1 standard defines a test access interface for integrated circuits. This interface permits testing of connections on a circuit board that contains the integrated circuits. The interface is called the TAP port (Test Access Port) and comprises a Test Data Input (TDI), a Test Data Output (TDO), a Test Clock Input (TCK), a Test Mode Select input (TMS), and a test state reset input (TRST). The TDI and TDO terminals of different integrated circuits are coupled in a daisy chain on a circuit board. The TCK, TMS and TRST inputs of the different integrated circuits are coupled in parallel.

The integrated circuit with the test interface is provided with a number of boundary scan cells coupled between the functional terminals of the integrated circuit and the core circuit of the integrated circuit. In addition, the boundary scan cells are coupled to each other to form a shift register structure for test access. A test controller (called TAP controller) controls operation of the boundary scan cells.

The standard defines a state machine operation of the TAP controller. State transitions are selected through the TMS input. Different state transitions provide entering and leaving a test mode. In the test mode, the boundary scan cells intercept signals between the core circuit and the terminals. Output cells supply test signals to the terminals instead of the core circuit and input cells capture data from the terminals. The states of the state machine provide for a shift state in which data is shifted from the test data input to the test data output via a chain of boundary scan cells. At specific state transitions, data that has been shifted through the chain is used to update test data that is output to the terminals, and at other transitions, data from the terminals is captured for transport through the chain.

In addition, the TAP controller provides for the application of commands through the TDI terminals. The commands may be used to switch specific integrated circuits to different sub-modes of the test mode, including a normal EXTEST mode in which test data can be shifted through the boundary scan cells and signals between the terminals and the core are intercepted, a bypass mode in which data is shifted from TDI to TDO bypassing the boundary scan cells in the integrated circuit, a functional mode in which the integrated circuit connects normally to its terminals while other integrated circuits are in test mode, and a CLAMP mode in which the integrated circuit disables updating of the data supplied from the boundary scan cells. In further modes, the test data is routed from the test data input TDI to the test data output TDO through internal scan chains selected by the instructions.

A serial shift register structure that runs through all boundary scan cells and, via the TDO-TDI connections, from one integrated circuit to another has advantages and disadvantages. The main advantage is that the wiring needed to supply test data to different integrated circuit can be minimized. The main disadvantage is that the serial structure slows down the speed with which the terminals of the integrated circuits can be accessed.

The slow access speed is partly addressed by providing bypass and clamp instructions. Bypass instructions supplied to selected integrated circuits effectively remove the boundary scan chains of selected integrated circuits from the overall chain on the printed circuit board and thus reduce the number of clock cycles needed to transport test data to or from a relevant boundary scan cell. The clamp instruction makes it possible to supply more useful data within the same number of clock cycles, because the signals at the terminals of all irrelevant integrated circuits are kept fixed and require no test data. As a result, data for successive updates of the relevant integrated circuit may be supplied instead of those for irrelevant integrated circuits. However, known instructions to set the integrated circuit for the bypass mode or the clamp mode apply to the integrated circuit as a whole, to bypass or clamp the scan chain as a whole.

The prior art has proposed further solutions to improve the access speed during testing. U.S. Pat. No. 6,430,718, for example, has proposed an integrated circuit wherein test data can be entered into a plurality of boundary scan cells in parallel from automated test equipment that is connected to a number of terminals in parallel. The test data is subsequently shifted to internal scan cells where it is used for test purposes. Depending on the instructions, the internal scan cells either receive test data from the test data input TDI directly or from the boundary scan cells to which the automatic test equipment is connected. Supplying test data in parallel increases the speed. Similarly, test results may either be passed to a number of terminals in parallel from a plurality boundary scan cells or fed to the test data output.

U.S. Pat. No. 6,018,815 also proposes to enter test data in parallel, but in this case via a number of dedicated terminals. This publication also proposes to provide a number of scan chains and test controller instructions to select which of these scan chains is coupled between the test data input TDI and the test data output TDO, as well as an instruction to couple all scan chains in series between the test data input TDI and the test data output TDO.

The proposed speed improvements, in terms of bypass instructions, clamping instructions, and instructions for parallel input and reconfiguration of the scan, aim at reducing the amount of time needed to pass data to or from terminals during testing. Not related to improvements of access speed, U.S. Pat. No. 5,991,908 discloses a family of FPGAs (Field Programmable Gate Arrays) and a hardwired device (a mask programmable circuit) that can emulate the operation of the FPGAs from any one of the family. The hardwired device is used to replace the FPGAs in circuit modules that have been sufficiently developed to permit mass manufacture without further design changes. Both the FPGAs and the hardwired device are provided with a boundary scan interface. Circuit boards that contain either the FPGA or the hardwired version are tested in the same way. However, since different FPGAs in the family have different numbers of terminals, which, moreover can be programmed as input or output terminals, it is necessary to reconfigure the boundary scan chain in the hardwired device so as to match that of the emulated FPGA. Obviously, this type of reconfiguration has to be performed only once, when the FPGA is programmed, presumably in the same way as the bulk of the FPGA is programmed. No more dynamic reconfiguration is described.

The Test Access Port has been more and more explored for use other than just structural testing. For programming Flash devices and PLDs it is already common to use the TAP for access. The five-pin connector is already on the PCB for structural testing, so additional connectors for programming are not needed, saving board space. The present invention considers the use of the TAP and the boundary scan implementation for design debug during prototyping and other types of access where a high throughput is required.

Development of an application or system consists of several stages. One of these stages is the development of the actual design for a consumer application like TV or DVD.

Before full production starts, prototypes will be developed. During prototyping, testing of the application comprises at least the following:

Electrical interconnection tests, often referred to as structural tests. The IEEE1149.1 standard is nowadays a well recognized and appreciated standard for structural testing of PCBs.

Functional tests will validate board interconnections that cannot be resolved in structural tests.

Debugging the actual design. During debugging, the functionality of the application (for example a TV or DVD) can be checked. This design debug phase is typical of prototyping where the actual design is not fixed yet. Here, incorrectnesses in the design can be remedied. When the application is in full production, debugging is not required anymore and functional and structural tests will validate the design's functionality.

During prototyping, board level debug is meant to eliminate design errors. This is an important step before production can start. Here, the focus will be on aspects like:
  design faults in the system,
  board layout faults
  software faults
  chip design faults in the application.

All these aspects are important in the total design debug step to evaluate correct functioning.

If design debug is to be done fast and efficiently, access to the ICs is of prime importance. Traditionally, this is done by contacting the available connectors on the PCB to monitor the data. Many functional data streams can be investigated in the traditional way. However, data streams not available at connectors can be important as well to be validated during prototyping. As the use of small outline packages and BGA grows rapidly, it is more and more difficult to perform measurements on the PCB. Probe access to these pins is then not obvious at all. Besides, the strong pressure on the cost of producing PCBs causes the application to take less surface on the board. Adding additional test spots for use with test needles is often not feasible. For this reason designers are looking for a trade-off between board space and the increasing programming and debug access capabilities required for ICs. Currently, data streams not accessible through standard devices cannot be validated, or it is at least very difficult to do so.

This design debug stage is a time-consuming and therefore an expensive part in the total cycle of product creation. Much expensive time is lost when looking for errors in a design that cannot be located owing to access problems. Other means of access and monitoring must be created to monitor data streams on these chips.

Debugging of the system also requires access through connectors or test points. Using the TAP port has already been demonstrated for chip level debug as well as for debugging software using the EJTAG port. Using the TAP port for board level debug of the design functionality is a logical extension. The implemented boundary scan architecture, which has contact to every IO pin of an IC, enhances the access to other pins. In the prototyping stage this makes it possible to monitor data streams to otherwise inaccessible pins without having to incorporate additional board design.

The Standard Boundary Scan test puts the application in the test domain, not in the functional domain. This avoids that functional data are passed through the chain towards the TAP connector or other pins in the application.

In principle, when one IC is put in EXTEST mode and all others are set to functional mode by using the BYPASS instruction, TDO can be used as an observer for functional data and TDI as a driver. The TAP connected to the IC carrying the debug data stream should be selected. For specific situations where predefined values must be put on pins, these ICs need to be set in CLAMP while the IC that transfers the data to the TAP needs to be in EXTEST.

The fundamentally static behavior of Boundary Scan, however, restricts the use for functionally by driven test or debug. The serial nature of the boundary scan chain reduces the effective clock frequency on the digital pins. Although the test frequency (TCK) is generally in the range of 10-20 MHz, most ASIC designs will have chains with 1000 cells, reducing the speed on IC pins (data rate) effectively to 10 kHz. For most (consumer) applications like DVDR and digital TV, 10 kHz can be considered as almost static. Usually this low frequency does not suffice for proper and reliable debugging of the functional features, which requires much higher speeds. Bypassing cells in the chain not required for performing the specific debug test can increase the effective speed. Besides, all pins of the IC are either in functional mode or in boundary scan mode when the normal boundary scan is performed.

It is an object of the invention to improve the suitability of a test interface of an integrated circuit for use in debugging.

It is another object of the invention to increase the access speed at which selected terminals in circuits can be accessed via a boundary scan chain.

The invention provides an integrated circuit according to claim 1. According to the invention, an integrated circuit which has a boundary scan chain for testing purposes supports a further mode, to which it can be switched by an instruction. The further mode is designed for debug purposes, but without deviating from the invention it may be used for other purposes that require efficient access. In the further mode, selectable first ones of the cells transport data serially along the boundary scan chain while selectable second ones of the cells write or read data that has been or will be transported through the first ones of the cells respectively in the further mode to or from the terminals from or to the scan chain. The first ones of the cells do not read or write data from or to the terminals in the further mode.

This is preferably realized by providing a multiplexing circuit that permits the first ones of the cells to be bypassed in the shift register structure in the further mode, when the second ones of the cells output or input data from or to the shift register structure, directly from the shift register structure or after latching in a scan flip-flop or an update flip-flop of the second one of cell.

Preferably, cells are selected to be first or second ones of the cells by means of configuration information that is loaded into configuration cells via the test interface.

Preferably, there is a configuration cell for each respective boundary scan cell, so that each boundary scan cell that supports the further mode can be selected to be a first or second one of the cells individually, independently of the other cells.

In a further embodiment, the update flip-flops of the boundary scan cells are used as configuration cells. During normal testing, update flip-flops function to supply test data to the functional output of the scan cell, but in the further mode they function to select whether individual cells operate as first or second ones of the cells.

In a first embodiment, the boundary scan chain can pass signals asynchronously in the further mode, without latching in the shift register structure. Data is read directly from selected terminals and/or written to those terminals and passed transparently along the scan path without being latched.

In a second embodiment, the boundary scan chain operates synchronously in the further mode, so that input data is latched before being passed through the boundary scan chain in the further mode and/or output data is latched before being output from the boundary scan chain.

In a further embodiment, the integrated circuit supports both modes, and an instruction to select in which mode the integrated circuit will operate.

Figure 2:
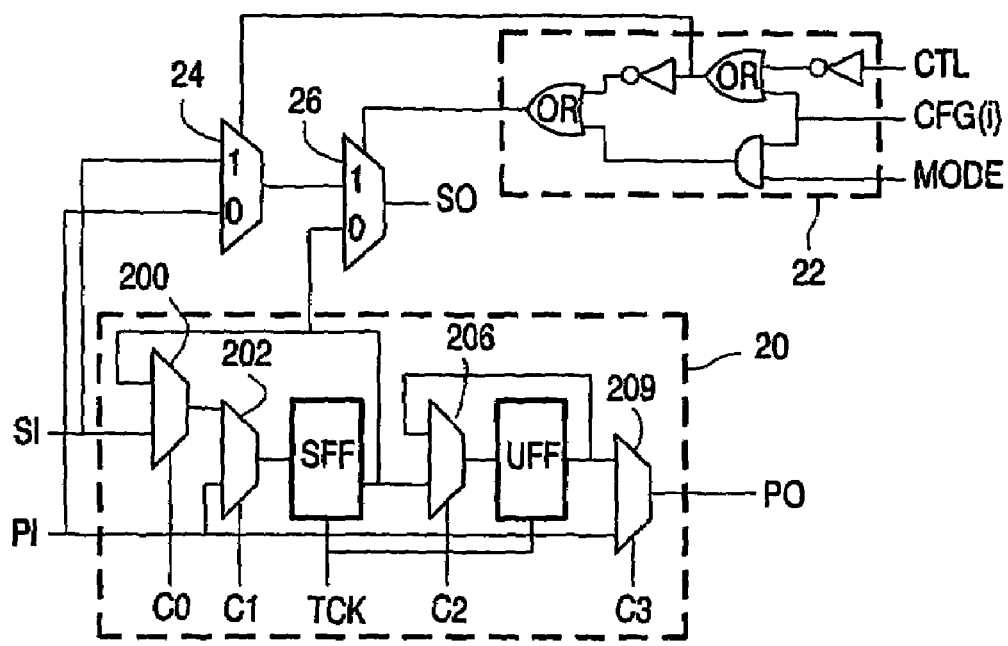
Figure 3:
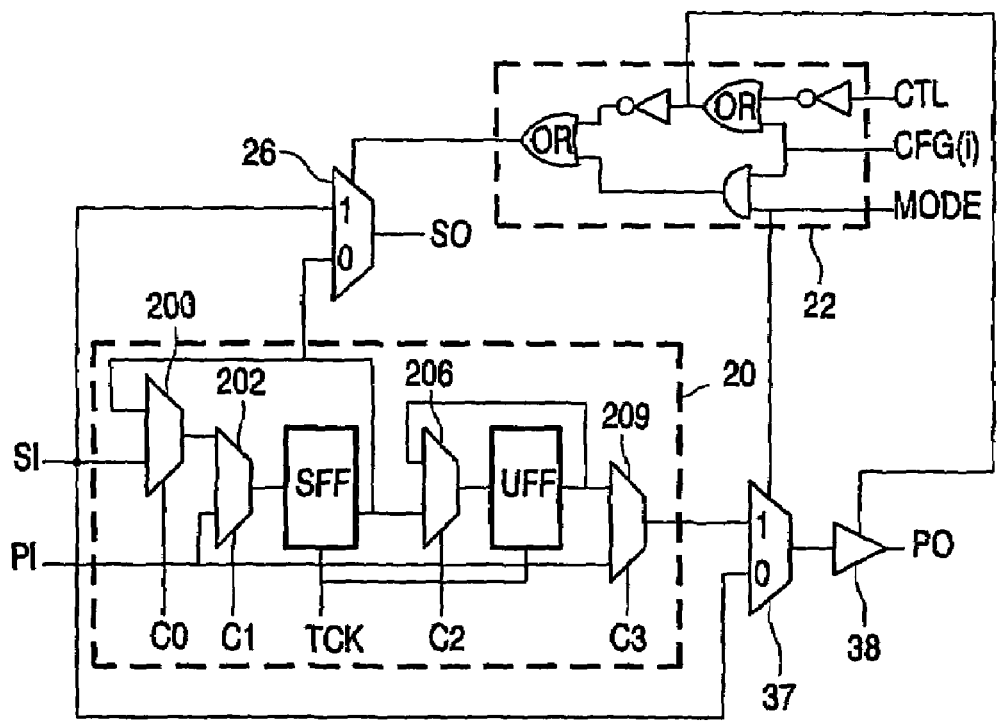
Figure 4:
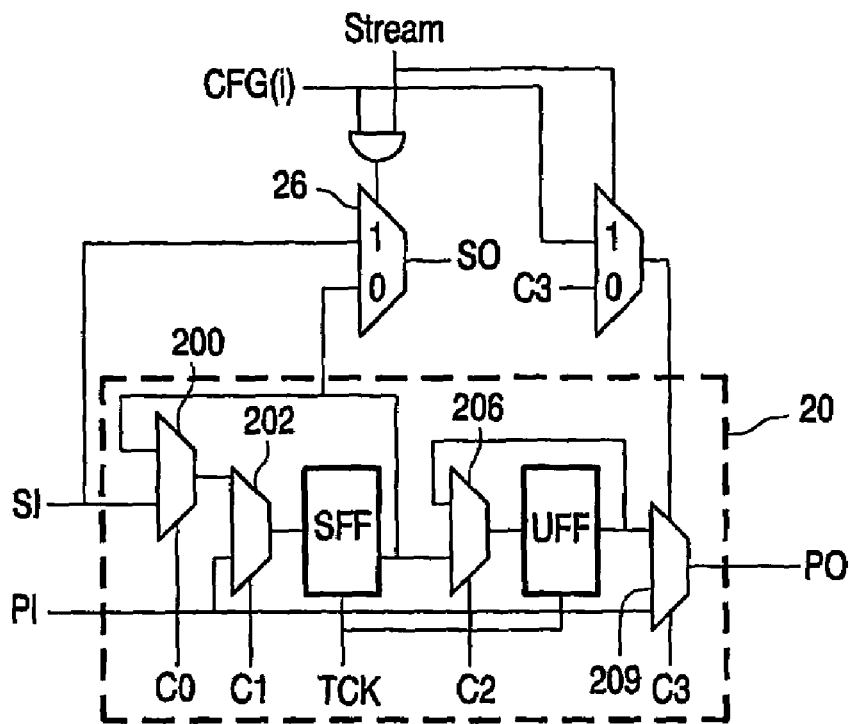
Figure 5:
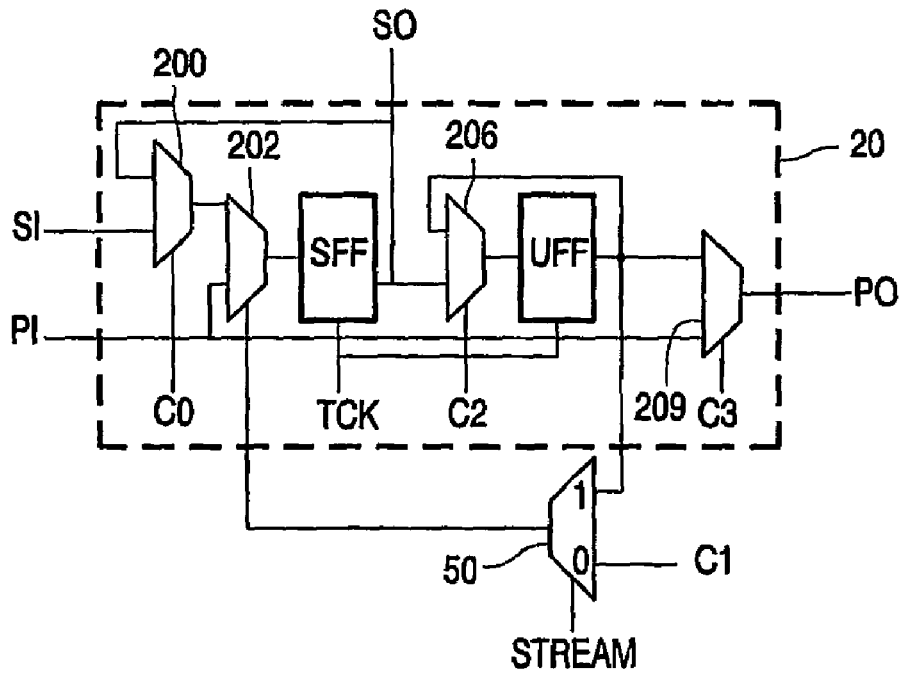
Figure 6:
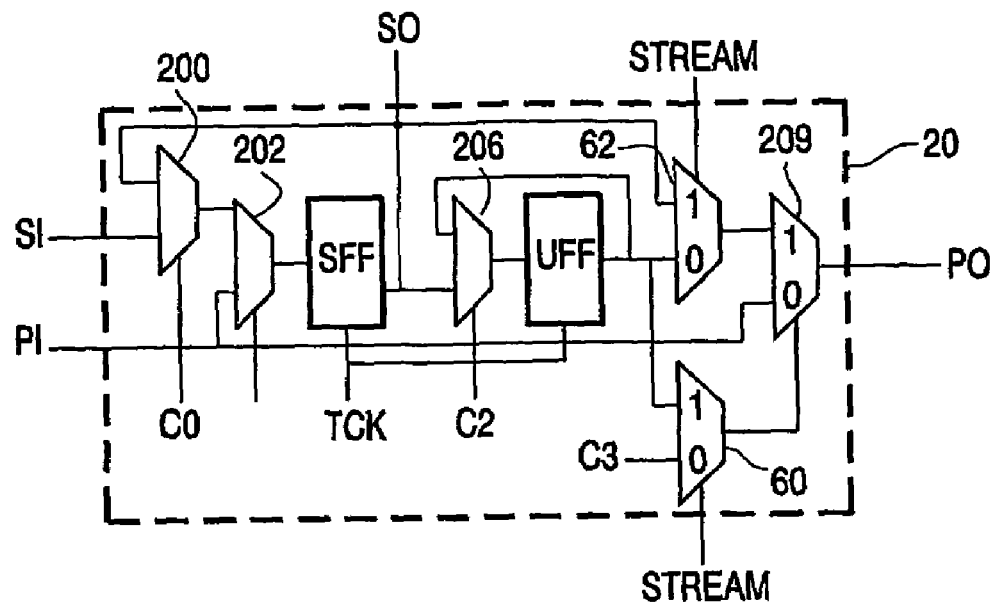
Figure 7:
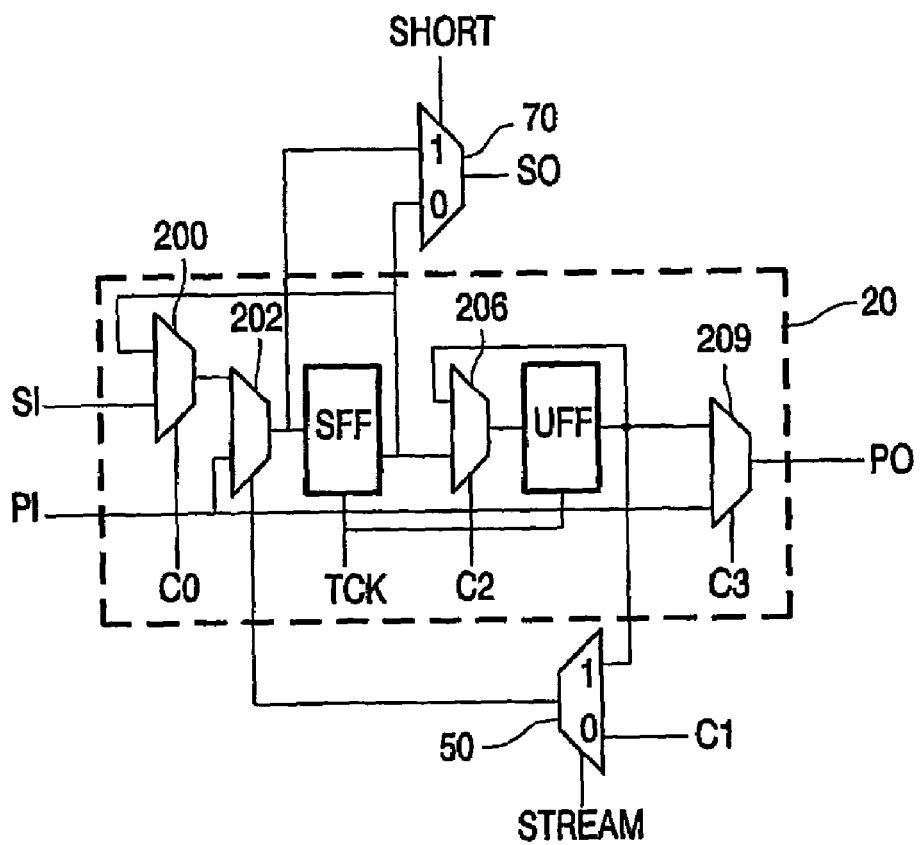
Figure 8:
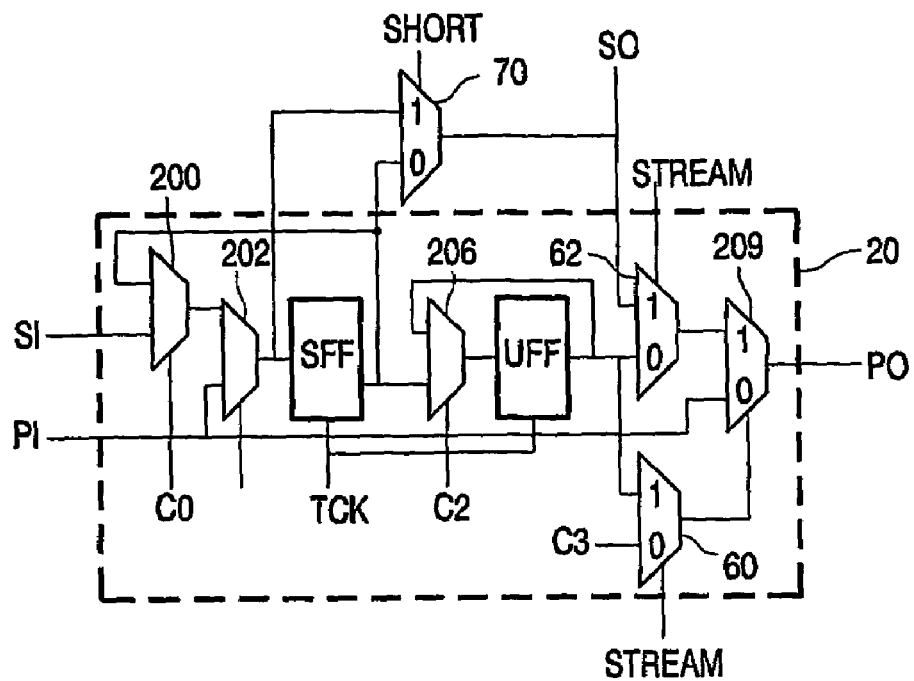
Figure 9:
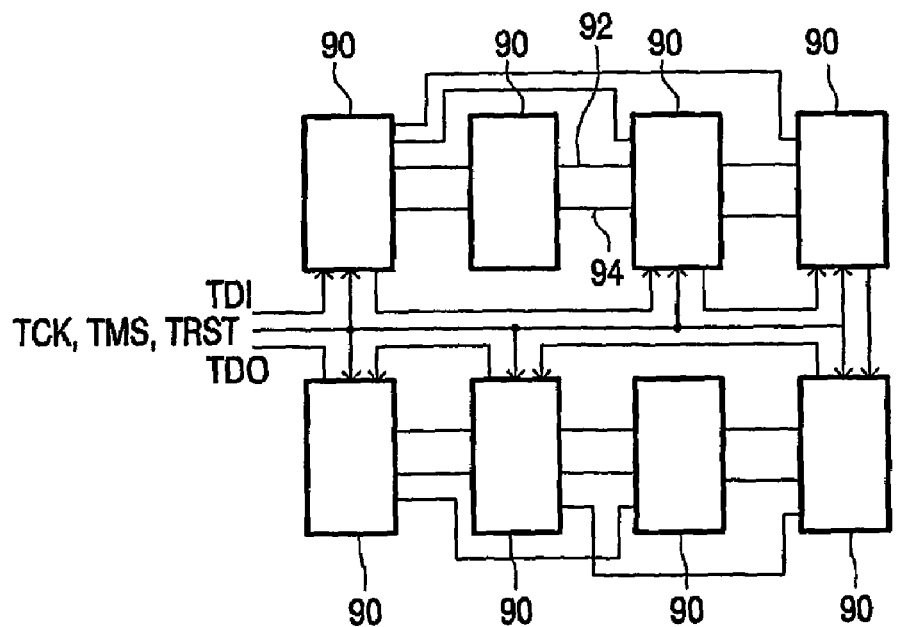

These and other objects and advantageous aspects of the invention will be described in more detail with reference to the following Figures FIG. 1 shows the architecture of an integrated circuit, FIG. 2 shows an input block for use in a boundary scan chain, FIG. 3 shows an output block for use in a boundary scan chain, FIG. 4 shows a further block for use in a boundary scan chain, FIG. 5 shows an input block for use in a boundary scan chain, FIG. 6 shows an output block for use in a boundary scan chain, FIG. 7 shows an input block for use in a boundary scan chain, FIG. 8 shows an output block for use in a boundary scan chain, and FIG. 9 shows a debug system When developing the first conceptual implementation, it is chosen to use standard boundary scan cells as defined by the IEEE1149.1 standard. The extension required is built around these standard cells. The extension to the basic architecture is the same for both modes. The difference occurs at cell or chip pin level and will be explained in the next two sections.

FIG. 1 shows the extended architecture of an integrated circuit (IC) chip, using the TAP port for access to the chip, and the boundary scan cells for access to the specific IC pins. The integrated circuit comprises a core circuit 10, external terminals 16, and a plurality of boundary scan blocks 12. Each boundary scan block 12 has a scan input SI, a scan output SO, a functional input PI, and a functional output PO (indicated for one block only for the sake of clarity). The boundary scan blocks 12 are coupled in a boundary scan chain in that the SO and SI of successive blocks are interconnected. Blocks 12 connect the core circuit 10 to the terminals 16 with the functional inputs and outputs PI, PO. Depending on whether the terminal is used as input or output, the functional input PI or the functional output PO of the scan block 12 is coupled to the terminal and the functional output PO or the functional input PO is coupled to the core circuit.

The integrated circuit has conventional P1149.1 test terminals TDI, TDO, TCK, TMS and TRST, and a TAP (Test Access Port) controller (TAP-C) coupled to the boundary scan blocks 12. For the sake of clarity, control connections to the blocks for conventional P1149.1 control are not shown. TAP controller TAP-C has outputs for signals CTL and MODE that are coupled in parallel to all boundary scan blocks 12.

The integrated circuit also contains a chain of configuration cells 14, which may be implemented as conventional scan cells. The chain of configuration cells is coupled between the test data input TDI and the test data output in parallel with the boundary scan chain. Under the control of instructions, TAP controller TAP_C controls which chain receives and transmits data between TDI and TDO. TAP controller TAP-C supplies a HOLD signal to configuration cells 14.

Each configuration cell 14 has a configuration signal output coupled to a configuration input of a respective one of the boundary scan blocks 12. Thus, the boundary scan blocks 12 receive common signals CTL and MODE and block-specific configuration signals.

Two modes (synchronous and asynchronous) are implemented in the same architecture. Two new private instructions are created in the instruction register of the boundary scan TAP controller, one for the synchronous mode (SYNC) and one for the asynchronous mode (ASYNC). These instructions select the required mode. A separate configuration register (the config cells) equal in length to the boundary scan chain is used to control each boundary scan cell block (BS block). The BS block is a part consisting of a standard boundary scan cell with additional logic needed for the debug modes. The configuration register holds the setting for each active and inactive pin for debug. Active refers to read and write access on the IC pin, inactive to not having read and write access. Control signals are required to make both modes possible. FIG. 1 only shows the additional control signals needed for this implementation. Control is achieved by global control lines (CTL, MODE, HOLD) and by local, cell-specific control lines (CFG(i)). The global control lines CTL and MODE are routed from the TAP controller to each BS block. HOLD is routed from TAP controller to each cell of the configuration register. The local lines CFG(i) are BS block-specific and routed between the BS block and the controlling cell of the configuration register.

Principle of Operation

When a mode is chosen, the configuration is loaded into the full configuration (shift) register. CFG(i)="1" indicates that the specific BS block will read or write functional data from the IC pin. A "0" indicates the opposite, the BS block is bypassed and no data is read or written from the IC pin. The HOLD signal guarantees that the configuration setting will not change during testing. After configuration the mode will be chosen by selecting the correct private instruction (SYNC or ASYNC). Either instruction will put the correct values on the global signals CTL and MODE. CTL guarantees that the total implementation still conforms to IEEE1149.1, MODE determines SYNC or ASYNC mode. The table below shows the required values for different situations.

| Mode | CTL | MODE | CFG(i) |
| --- | --- | --- | --- |
| SYNC | 1 | 0 | 0/1 |
| ASYNC | 1 | 1 | 0/1 |
| EXTEST | 0 | 0 | X |

Input Pins and Output Pins

The BS block itself determines how the specific mode is incorporated in the cell design. For this extended architecture, the additional logic surrounds the basic boundary scan cell. The standard boundary scan cell design is not changed for the purpose of prototyping. The standard boundary scan protocol for the state machine is also used for the two new modes. For this reason the values for C0-C3 are determined by automated boundary scan implementation software.

FIG. 2 shows the actual design for an input boundary scan block. Element 20 is a standard boundary scan input cell, with inputs coupled to a scan input SI and a functional input PI (coupled to an external terminal of the IC) and outputs coupled to a scan output SO and a functional output PO coupled to a core circuit of the IC. Decode logic 22 is provided for generating the control signals. In addition, only two multiplexers 24, 26 are used to create the proper routing of the test signals for both modes.

The standard boundary scan cell 20 comprises an input multiplexing circuit 200, 202, a scan flip-flop SFF, an update multiplexer 206, an update flip-flop UFF, and an output multiplexer 209. Scan input SI, functional input PI, and an output of scan flip-flop SFF are coupled to inputs of first multiplexing circuit 200, 202. Multiplexing circuit 200, 202 has an output coupled to a data input of scan flip-flop SFF. Update multiplexer 206 has inputs coupled to a data output of scan flip-flop SFF and an output of update flip-flop UFF. Update multiplexer 206 has an output coupled to a data input of update flip-flop UFF. Output multiplexer 209 has inputs coupled to functional input PI and a data output of update flip-flop UFF. Output multiplexer 209 has an output coupled to functional data output PO. Scan flip-flop SFF and update flip-flop UFF are clocked from test clock input TCK. First multiplexing circuit 200, 202 is controlled by signals C0, C1 from the TAP controller, update multiplexer 206 is controlled by a signal C2 from the TAP controller, and output multiplexer 209 is controlled by a signal C3 from the TAP controller. C0-3 are standard IEEE 1149.1 signals, used to switch boundary scan cell 20 to various modes of operation.

Scan flip-flop SFF may comprise a series connection of two flip-flops which load data from their inputs at mutually opposed clock transitions of the test clock TCK. Alternatively, the first one of these flip-flops may be placed anywhere in the path from the scan input SI to scan flip-flop SFF, but not in the connection between the scan input SI and first additional multiplexer 24.

First additional multiplexer 24 has inputs coupled to functional data input PI and to scan input SI. Second additional multiplexer 26 has inputs coupled to an output of first additional multiplexer 24 and the data output of scan flip-flop SFF. An output of second additional multiplexer 26 is coupled to scan output SO. It will be appreciated that additional multiplexers 24, 26 function as a three-input multiplexing circuit, which can couple any of its inputs to its output. Without deviating from the invention, other multiplexing circuits may be used for this purpose.

Decode logic 22 has inputs for a control signal CTL, a mode selection signal MODE, and a configuration signal CFG(i) for the block. Decode logic 22 feeds the logic OR of CFG(i) and the inverse of CTL to a control input of first additional multiplexer 24. Decode logic 22 feeds a further logic OR of the inverse of this logic OR and the logic AND of the MODE signal and the configuration signal to the control input of second additional multiplexer.

The reader can easily verify, using the table, that normal EXTEST is still compliant with the standard. That is, when decode logic sets second additional multiplexer 26 to pass the output signal from scan flip-flop SFF, the circuit will operate as a conventional boundary scan cell.

In FIG. 3 the actual design for an output block is shown. Here the functional input is coupled to the core circuit and the functional output is coupled to the external terminal. The output block contains a standard boundary scan cell 20 and decode logic 22, which are identical to those of the input block. Compared with the input block, the first additional output multiplexer is omitted from the output block, the second additional multiplexer 26 having inputs coupled to scan input SI and the data output of scan flip-flop of the boundary scan cell. In addition, a further output multiplexer 37 and a tri-state buffer 38 are included. The output of output multiplexer 209 and the scan input SI are coupled to the inputs of further output multiplexer 37, which has an output coupled to functional output PO via tri-state buffer 38. The control signal of further output multiplexer 37 is the MODE signal. Tri-state buffer 38 is controlled by the logic OR of CFG(i) and the inverse of CTL. The tri-state buffer 38 is added to make the connected IC pin tri-state. By taking CFG(i)=0 the pin is set inactive. For this design of the output block it can be verified that EXTEST is still compliant with the standard.

The next two sections will discuss the operation of the input and output pin for each mode in more detail.

Synchronous Mode—Reconfigurable Boundary Scan

The synchronous mode is strongly related to normal boundary scan. The main difference is that the standard chain length will be adapted to the debug situation. This can be done in-circuit and provides the possibility to have several independent data streams over one or more pins. The effective transfer speed is higher compared with a normal boundary scan because of the reconfigurable character of the chain.

Considering FIG. 2 again, the operation of the block in SYNC mode can be understood. The specific pin can be set active (used for data streams) or inactive (not used for data streams) with the configuration signal CFG(i). The Table shows the values on the multiplexers A and B that create the required paths.

| Input cell | Mux. A | Mux. B | CFG(i) |
|---|---|---|---|
| Active | 1 | 0 | 1 |
| Inactive | 0 | 1 | 0 |

The table shows that a transparent path is created from SI to SO when the cell is set inactive. When active, SFF is used to create a path from PI to SO and UFF puts the data to the core (as defined by IEEE1149.1). With the normal boundary scan state machine protocol for the cell, the latter path is a normal boundary scan path.

For output cells the table below is valid (see also FIG. 3).

| Output cell | Mux. A | Mux. B | Buffer ENA | CFG(i) |
|---|---|---|---|---|
| Active | 0 | 0 | 1 | 1 |
| Inactive | 0 | 1 | 0 | 0 |

When the cell is active, normal clocking by the state machine is used. A path from SI through the boundary scan cell to PO is created. The buffer is enabled. When inactive, the same transparent path from SI to SO is created as for the input cell. The buffer is tri-stated.

The character of this implementation is one of a reconfigurable boundary scan chain.

Data Rate Over the IC Pins

The advantage of adapting the chain in-circuit to a few cells is that the effective data rate or transfer frequency on the IC pin is increased.

To understand this, consider a chip with 100 boundary scan cells, a TCK frequency of 20 MHz, and one single pin set active. For standard EXTEST it takes 104 TCK cycles to put the first data bit on the active pin. About 4 TCK cycles are used for the state machine and 100 TCK cycles are needed to shift through the chain. This equals a data transfer rate of 0.2 MHz.

Using a reconfigurable boundary scan chain, the configuration will be such that this specific cell/pin is the only cell in the chain. This reduces the chain length from 100 cells to a single cell. The increase in the effective data rate is obvious. Once again, 4 cycles for the state machine but only 1 for shifting, providing a frequency of 20/5=4 MHz on the pin. Moreover, when 6 pins are selected, the frequency becomes 20/10=2 MHz. In the limit the normal boundary scan chain is selected with its low speed (with all characteristics of normal boundary scan). This frequency range (1-5 MHz) is often suitable for testing functionality of a design. It is to be noted that one or two multiplexers in the scan path do not limit the effective speed, but do limit speed many consecutive cells are inactive. In that case each cell will add one or two multiplexers to the scan path. Then, for correct clocking in synchronous mode the total delay of these multiplexers can not exceed ½TCK.

Data Streaming on IC Pins

In the synchronous mode the normal clocking protocol as defined by IEEE1149.1 is used. Similar to normal structural testing, the synchronous mode can read and write different data streams on different pins. The use of a reconfigurable chain by this mode makes it possible that cells/pins that are not selected for testing are transparently routed from SI to SO. While the total length of the chain is reduced, each active pin will behave in conformity with the standard protocol. The selected chain is loaded with data followed by an update stage. This process is repeated for longer data streams. Each active pin can carry different data.

Asynchronous Mode—Direct Data Streaming

The asynchronous mode is of importance when speed is the key issue during testing. This mode is quite different from the synchronous mode since it does not use the actual boundary scan cell. Data is directly read or written from the IC pin and directly transferred towards the scan path. Any path created is a transparent path. The settings for input cells are shown in the Table below (see also FIG. 2).

| Input cell | Mux. A | Mux. B | CFG(i) |
| --- | --- | --- | --- |
| Active | 1 | 1 | 1 |
| Inactive | 0 | 1 | 0 |

The operation is straightforward. Multiplexer B is always "1" since the boundary scan cell output is never used. Multiplexer A creates a transparent path from SI to SO when the cell is inactive and a path from PI to SO when the cell is active. The Table below is valid for output cells (see also FIG. 3).

| Output cell | Mux. A | Mux. B | Buffer ENA | CFG(i) |
| --- | --- | --- | --- | --- |
| Active | 1 | 1 | 1 | 1 |
| Inactive | 1 | 1 | 0 | 0 |

When the cell is inactive, a path from SI to SO is created with a tri-stated buffer. When active, the buffer is enabled and the transparent path SI to SO is created to allow that data is directly passed to other pins as well.

Data Rate Over the IC Pins

Clocking is avoided in the asynchronous mode. This provides an opportunity to go beyond the limits of the normal boundary scan TCK frequency. In fact once in this mode with the correct settings, the scan path is free for any digital functional data. The data is read or written to the IC pin in real time. The data rate is mainly limited by the test signal. If this signal comes from a JTAG tester, it is generally limited to 20 MHz. If real-time data from another chip on the board is tested, however, the limit is theoretically determined by functional design. As in the synchronous mode, delay introduced by the multiplexers in the scan path is present. Nevertheless, this delay will not be critical for debug here because clocking is not an issue.

Data Streaming on IC Pins

In the asynchronous mode, high-speed signals can be directly transferred to the pins, but all pins will have the same data stream. This is because the implementation consists of parallel connections. No hold function for data is used as is done in the synchronous mode. In practice, this mode will generally be used for testing data on a single pin. However, to place the IC in this asynchronous mode, interference by the TAP controller is required since this controls the additional multiplexers. After this initialization, the selected pins are free to transfer data when the TAP controller is in the shift stage.

SECOND EMBODIMENT

In the second embodiment only a single debug mode is implemented by way of example, which provides a bypassing of inactive cells. Instead of the control signals CTL, MODE, the TAP controller supplies a control signal "STREAM" to all cells to switch the cells between the normal mode and the debug mode.

FIG. 4 shows a second embodiment of a boundary scan block. Compared with the input block of FIG. 2, a number of changes have been made. The first additional multiplexer 24 has been omitted. Additional multiplexer 26 has inputs coupled to serial scan input SI and the data output of scan flip-flop SFF. The control input of additional multiplexer 26 is coupled to the output of a logic gate that produces the logic AND of the configuration input CFG(i) of the cell and the STREAM signal. A control multiplexer 40 is provided, which has inputs coupled to the configuration input CFG(i) and the conventional control input C3 of output multiplexer 209. The output of control multiplexer 40 is coupled to the control input of output multiplexer 209. The control input of control multiplexer 40 is coupled to the STREAM input.

In operation, when "STREAM" is logically low, the block operates as a normal 1149.1 cell. When STREAM is logically high, operation depends on configuration signal CFG(i) of the block. Blocks that are selected to be inactive (CFG(i)=0) bypass the scan input SI to the scan output SO and the functional input PI to the functional output. Blocks that are selected to be active (CFG(i)=1) shift data from the scan flip-flop SFF to the scan output and pass data from the update flip-flop UFF to the functional output.

The length of the boundary scan chain can thus be adapted by means of the configuration signals to eliminate inactive blocks from the chain. The active blocks can be operated as normal boundary scan cells in the shortened chain. The inactive blocks connect the terminals 16 to the core circuit 10.

THIRD EMBODIMENT

In the third embodiment the update flip-flop of the boundary scan cells is used to supply the configuration signal.

FIG. 5 shows the input block of the third embodiment. A conventional boundary scan cell is used, except that a first control multiplexer 50 has been added. First control multiplexer 50 has inputs coupled to the output of the update flip-flop UFF and the conventional P1149.1 control input C1 that is used to control capture of data from the functional input PI. The output of first control multiplexer 50 is coupled to the input of multiplexing circuit 200, 202 that controls capture of data from the functional input PI. The control input of first control multiplexer 50 receives the STREAM signal.

FIG. 6 shows the output block of the third embodiment. Again a conventional boundary scan cell is used, except that a second control multiplexer 60 and an update bypass multiplexer 62 have been added. The second control multiplexer 60 has inputs coupled to receive the output signal of update flip-flop UFF and the conventional P1149.1 signal C3 that conventionally controls output multiplexer 60. A control input of second control multiplexer 60 is coupled to receive the STREAM signal. Second control multiplexer 60 has an output coupled to a control input of output multiplexer 209.

Update bypass multiplexer 62 has inputs coupled to the data output of update flip-flop UFF and the data output of scan flip-flop SFF. A control input of update bypass multiplexer 62 is coupled to receive the STREAM signal. Output multiplexer 209 has inputs coupled to the output of the bypass multiplexer and the functional data input PI.

In operation the normal boundary scan protocol is first executed to load configuration data into the update flip-flops. Subsequently the normal boundary scan protocol is used to load an instruction for the TAP controller to set STREAM logic high. The content of update flip-flop UFF controls whether cells are active when the STREAM signal sets the integrated circuit to the debug mode.

In those input cells where the content of update flip-flop UFF is logically low, scan flip-flop SFF only functions as part of the shift register structure and is not used to capture data from the functional input PI. The input cells where the content of update flip-flop UFF is logically high capture data from functional input PI at every TCK clock cycle. This is used when the TAP controller is made to assume the shift state repeatedly, which during normal 1149.1 testing merely serves to shift test data through the shift register structure. When STREAM is logically high and TAP controller is made to assume the shift state repeatedly, data is captured in selected input cells in every TCK clock cycle and subsequently shifted from the input cell through the shift register structure.

In the output cells, when STREAM is logically high, those output cells where the content of update flip-flop UFF is logically low pass data from functional input PI to functional output PO. The output cells where the content of update flip-flop UFF is logically high pass data from the shift register structure to functional output PO.

In use, most update flip-flops are loaded with logically low values. The cells in the boundary scan chain in which update flip-flop UFF is loaded with logically high values are input and output cells alternately.

In one example, the update flip-flop UFF of only one input cell is loaded with a logically high value and the update flip-flops UFF of all other cells are set logically low. As a result data is captured in that one input cell and transported to TDO through the chain in each TCK clock cycle when STREAM is logically high and the TAP controller is made to assume the shift state.

In another example, the update flip-flop UFF of only one output cell is loaded with a logically high value and the update flip-flop UFF of all other cells are set logically low. As a result data supplied from TDI through the boundary scan chain is output from that one output cell in each TCK clock cycle when STREAM is logically high and the TAP controller is made to assume the shift state.

In a further example, the update flip-flops UFF of only one output cell and only one input cell are loaded with a logically high value. If the input cell precedes the output cell in the boundary scan chain, this results in data capture in the input cell, followed by transport through the boundary scan chain and output from the output cell in every clock cycle when STREAM is logically high and the TAP controller is made to assume the shift state. Thus a stream is created from the functional input PI of the input cell to the functional output of the output cell, which transports one bit in every TCK cycle.

It will be appreciated that any number of such streams can be passed in parallel by setting the update flip-flops UFF of pairs of input-output cells.

If the first cell in the boundary scan chain in which the content of update flip-flop UFF is logically high is an output cell, data is passed from TDI to that output cell in every TCK cycle. Similarly, if the last cell in the boundary scan chain in which the content of update flip-flop UFF is logically high is an input cell, data is passed from that input cell to TDO in every TCK cycle.

FOURTH EMBODIMENT

Like the third embodiment, the fourth embodiment uses the update flip-flop to control whether cells are active. In the fourth embodiment, however, the scan flip-flops are bypassed in the debug mode. This means that signals are passed directly along the boundary scan chain, without the need to shift under control of TCK. A control signal "SHORT" is added to control bypassing, which is issued by the TAP controller and set to logically high in response to a corresponding command.

FIG. 7 shows an input cell according to the fourth embodiment. Compared with the third embodiment, a bypass multiplexer 70 has been added, with inputs coupled to the data input and data output of scan flip-flop SFF, an output coupled to scan output SO of the cell, and a control input coupled to receive the SHORT signal.

FIG. 8 shows an output cell according to the fourth embodiment. Compared with the third embodiment, a bypass multiplexer 70 has been added, with inputs coupled to the data input and data output of scan flip-flop SFF, an output coupled to scan output SO of the cell, and a control input coupled to receive the SHORT signal. The output of bypass multiplexer is also coupled to an input of update bypass multiplexer 62 instead of the data output of scan flip-flop.

In operation, the conventional boundary scan protocol is first used to load configuration data into the update flip-flops. Subsequently an instruction is supplied to the TAP controller using the conventional boundary scan protocol to set SHORT logically high. As a result a direct connection is opened up along the boundary scan chain. In cells that are selected to be active by the configuration data, the functional input PI (if the cell is an input cell) and/or to the functional output PO (if the cell is an output cell) is connected to this direct connection. Thus a direct connection is set up between the functional inputs PI and functional outputs PO of active cells. In input cells that are not active, the input signal from the functional input PI or the signal from update flip-flop UFF is passed to the functional output, depending on test control signal. In output cells that are not active, the input signal from the functional input PI is passed to the functional output PO.

FIG. 9 shows a debug system with a number of interconnected integrated circuits 90. Two connections 92, 94 are indicated specifically. Part of the integrated circuit is connected via a test interface, with daisy-chained TDI, TDO inputs and outputs and parallel TCK, TMS, TRST inputs (only one input shown for the sake of clarity). The invention renders it possible to set one or several integrated circuits 90 to the debug mode, after which debug signals can be output and input at a high rate, or even continuously via connections 92, 94 to other integrated circuits from the selected integrated circuit or circuits.

It will be realized that the invention is not limited to the specific embodiments disclosed in the Figures. For example, various sources may be used to supply output signals from the functional outputs PO of inactive cells. The embodiments show the use of signals from the functional input PI or signals from the update flip-flop by way of example. Instead, a default signal may be supplied or any other convenient signal. Although each embodiment shows the use of a specific source, it should be realized that any other source may be used instead. Even a programmable selection from a plurality of sources may be used. Under some circumstances it is desirable that the entire circuit operates functionally, except for terminals where debug signals are injected. In this case the inactive cells preferably connect functional inputs PI and functional outputs PO. Under other circumstances a fixed output is preferred, in which default signals or signals from the update flip-flops may be used.

Furthermore, it will be realized that, although it is preferred to use the update flip-flop of each particular cell as the configuration flip-flop for that particular cell, there is of course no objection to using the update flip-flop of one cell as the configuration flip-flop for another cell. Each configuration flip-flop may control configuration of a respective cell, but of course a configuration flip-flop may control the configuration of a plurality of cells in parallel. Thus, at least part of the update flip-flops need not be used as configuration flip-flops, leaving these update flip-flops free to supply programmable signals to the functional outputs. Configuration flip-flops that do not double as update flip-flops may also configure multiple cells, or relieve the update flip-flop of specific cells from configuring the cell.

Furthermore, it will be appreciated that the cells of any one of the embodiments may be arranged so as to be programmable to operate in one of the described debug modes only or in a selectable one of a plurality of debug modes. The invention is not limited to the use of the particular control signals (e.g. CTL, MODE) used in the embodiments: other types of control signals may be used.

Part of the cells in the same circuit (or even in the same integrated circuit) may be implemented according to one embodiment and another part may be implemented according to another embodiment. In particular, for example, the fourth embodiment may be used for a number of cells to speed up data transport, another embodiment being used for other cells to provide some form of pipelining. Part of the boundary scan cells may even be implemented completely as conventional boundary scan cells, i.e. without supporting a further mode. Thus, a further conventional boundary scan chain may be intermingled or placed in series with the boundary scan chain according to the invention.

Furthermore, it should be realized that the actual circuits shown in the embodiment are merely provided by way of example. For example, the multiplexing functions could be realized with various alternative circuits. Similarly, although conventional P1149.1 test states are preferably used to control signal generation by the TAP controller, it will be realized that dedicated states may be used when the integrated circuit has been switched to the debug mode.

Furthermore, it should be appreciated that, although the invention has been described for debug purposes, the disclosed circuitry may be used for other purposes, such as programming of a non-volatile memory or programming of a programmable circuit such as gate arrays.

The invention claimed is:

1. An integrated circuit comprising:
   a core circuit;
   terminals for coupling the core circuit to circuitry external to the integrated circuit,
   a test data input and a test data output;
   a boundary scan chain comprising cells coupled between the test data input and output in a shift register structure, each cell also coupled between a respective one of the terminals and the core circuit,
   a test control circuit arranged to switch the boundary scan chain between a functional mode, in which the cells permit signal flow between the terminals and the core circuit, and a test mode, in which test data is shifted serially through the cells along the boundary scan chain and in which the cells intercept signal flow between the respective ones of the terminals and the core circuit,
   wherein the test control circuit is arranged to execute an instruction to switch the boundary scan chain to a further mode, in which further mode selectable first ones of the cells transport data serially along the boundary scan chain while selectable second ones of the cells write or read data that has been or will be transported through the first ones of the cells in the further mode to or from the terminals from or to the scan chain.

2. An integrated circuit according to claim 1, comprising configuration cells for respective cells of the boundary scan chain, the configuration cells being loadable with configuration data from the test data input, each cell of the boundary scan chain having a configuration input coupled to its configuration cell for selecting whether the cell of the boundary scan chain has to function as one of the first ones or one of the second ones of the cells under the control of the configuration data.

3. An integrated circuit according to claim 2, wherein each of the cells of the boundary scan chain comprises a scan flip-flop and an update flip-flop, the scan flip-flops of successive cells in the boundary scan chain being coupled serially to form the shift register structure, the update flip-flop of the cell being coupled to the shift register structure to receive test data from the scan flip-flop, the update flip-flop supplying the test data to the respective one of the terminals to which the cell is coupled in the test mode, and wherein the update flip-flop of at least part of the cells function as said configuration cells to supply configuration data in the further mode.

4. An integrated circuit according to claim 3, each cell of the boundary scan chain comprising a multiplexing circuit with inputs coupled to the shift register structure and to the core circuit, an output coupled to the terminal for the cell, and a control input coupled to the test control circuit and to an output of the update flip-flop of the cell, so that in the further mode the multiplexing circuit couples the core circuit to the terminal when the update flip-flop indicates that the cell is a first one of the cells and the multiplexing circuit couples the shift register structure to the terminal when the update flip-flop indicates that the cell is a second one of the cells.

5. An integrated circuit according to claim 1, wherein each cell comprises:
   a scan input (SI) and a scan output, the test data input being coupled to the scan input (SI) of a frontmost one of the cells in the boundary scan chain, each further one of the cells having its scan input coupled to the scan output of a preceding one of the cells, and a final one of the cells having its scan output (SO) coupled to the test data output;

a scan flip-flop having an input coupled to the scan input (SI) of the cell;

a multiplexing circuit comprising inputs coupled to the scan input of the cell and to an output of the scan flip-flop, the multiplexing circuit having an output coupled to the scan output of the cell and to a control input;

a configuration input coupled to the control input of the multiplexing circuit for selecting that the multiplexing circuit couples the scan input to the scan output in the further mode if the cell is selected to be a first one of the cells.

6. An integrated circuit according to claim 5, wherein each cell has a functional input coupled to an input of the scan flip-flop, at least part of the cells being input cells, the multiplexing circuit of each input cell comprising a further input coupled to the functional input, the multiplexing circuit being arranged to couple the functional input to the scan outputs in the input cells in the further mode if the input cell is selected to be a second one of the cells.

7. An integrated circuit according to claim 5, wherein each cell has a functional input coupled to an input of the scan flip-flop, at least part of the cells being input cells, the multiplexing circuit of each input cell comprising a further input coupled to the functional input, the multiplexing circuit being arranged to couple the functional input to an input of the scan flip-flop and an output of the scan flip-flop to the scan output in the further mode if the cell is selected to be a second one of the cells.

8. An integrated circuit according to claim 5, wherein each cell has a functional output, and wherein at least part of the cells are output cells, the multiplexing circuit of each output cell being arranged to couple the functional output to the scan output in the output ones of the cells in the further mode if the output cell is selected to be a second one of the cells.

9. An integrated circuit according to claim 5, wherein each cell has a functional output, at least part of the cells being output cells, comprising an output circuit coupled between the scan flip-flop and the functional output, the output circuit of each output cell being arranged to output data received from the shift register structure at the functional output in the further mode if the cell is selected to be a second one of the cells and to prevent data from the shift register structure from being output at the functional output in the further mode if the cell is selected to be a first one of the cells.

10. An integrated circuit according to claim 9, wherein each cell comprises an update flip-flop coupled between the shift register structure and the output circuit, the output circuit outputting data signals latched into the update flip-flop from the update flip-flop to the functional output in the further mode if the cell is selected to be a second one of the cells.

11. An integrated circuit according to claim 9, wherein the output circuit outputs data signals continuously from the shift register structure to the functional output in the further mode if the cell is selected to be a second one of the cells.

12. An integrated circuit according to claim 9, wherein the output circuit of each output cell has a multiplexing function and multiplex inputs are coupled to the functional input of the cell and to the shift register structure, the output circuit coupling the functional input to the functional output in the further mode if the cell is selected to be a first one of the cells.

13. An integrated circuit according to claim 1, wherein each cell comprises a scan flip-flop, the scan flip-flops of successive cells in the boundary scan chain being coupled in series in the shift register structure, the control circuit supporting an instruction for switching the integrated circuit to asynchronous operation in said further mode, the first ones of the cells creating a transparent path bypassing the scan flip-flops of the first ones of the cells in the shift register structure in asynchronous operation, such that data are being directly written or read to or from the terminals from or to the shift register structure in the second ones of the cells in asynchronous operation.

14. An integrated circuit according to claim 13, the control circuit supporting a further instruction for switching the integrated circuit to synchronous operation in said further mode, a length of the boundary scan chain being adapted in that the first ones of the cells are made transparent along the shift register structure in the synchronous mode.

15. An integrated circuit according to claim 1, wherein each cell comprises a scan flip-flop, the scan flip-flops of successive cells in the boundary scan chain being coupled in series in the shift register structure, the control circuit supporting an instruction for switching the integrated circuit to synchronous operation in said further mode, a length of the boundary scan chain being adapted in that the first ones of the cells are made transparent in the shift register structure in the synchronous mode.

16. An integrated circuit according to claim 1, wherein the control circuit comprises a state machine defining a plurality of states which the state machine assumes under the control of a test protocol in the test mode and which determine control signals issued to control inputs of the cells for controlling the cells, said test protocol being used to control the state machine also in the further mode, each cell having further control inputs for receiving a control signal that indicates whether the integrated circuit operates in the further mode and a configuration signal that distinguishes whether cells function as a first one of the cells or a second one of the cells, for controlling the cell with the control signals issued to the inputs in combination with the control signal and the configuration signal.

17. An integrated circuit according to claim 16, wherein the states include a shift state in which the control circuit controls the cells to shift data through the shift register structure in the test mode, the cells being arranged such that the second ones of the cells transport the data that has been or will be transported through the first ones of the cells in the shift state between the scan chain and the terminals or the core circuit when the state machine is in the shift state.

18. An electronic circuit, comprising an integrated circuit according to claim 1 and one or more further integrated circuits coupled to the terminals of the integrated circuit, wherein test inputs and outputs of the integrated circuits are coupled in a daisy chain, and test control inputs of the integrated circuits are coupled in parallel.

19. A method of operating an electronic circuit that comprises an integrated circuit and a further circuit coupled to each other, the integrated circuit comprising a boundary scan chain with cells coupled between a test data input and output of the integrated circuit in a shift register structure, each cell being also coupled between a respective one of terminals of the integrated circuit and a core circuit of the integrated circuit, the integrated circuit being switchable to a functional mode, in which the cells permit signal flow between the terminals and the core circuit, to a test mode, in which test data is shifted serially through the cells along the boundary scan chain and in which the cells intercept signal flow between the respective ones of the terminals and the core circuit, and upon an instruction, to a further mode in which selectable first ones of the cells transport data serially along the boundary scan chain while selectable second ones of the cells write or read data that has been or will be transported through the first ones of the cells in the further mode to or from the terminals from or to the scan chain, wherein the method comprises a step of:

switching the integrated circuit to the further mode and supplying and/or extracting successive signals to and/or from selected ones of the terminals through the boundary scan chain, while not transporting signals through the scan chain for or from other ones of the terminals intervening between the successive signals.

20. A method according to claim 19, wherein a particular one of the cells is configured to be a second one of the cells, all other cells that precede said particular one of the cells along the boundary scan chain from the test data input being configured to be first ones of the cells.

21. A method according to claim 19, wherein a particular one of the cells is configured to be a second one of the cells, all other cells that succeed said particular one of the cells along the boundary scan chain to the test data output being configured to be first ones of the cells (14).

22. A method according to claim 19, wherein an input one of the cells and an output one of the cells that succeeds the input one of the cells directly or indirectly along the boundary scan chain are configured to be second ones of the cells, any intervening cells between the input one of the cells and the output one of the cells all being configured to be first ones of the cells.

23. A method according to claim 19, comprising a bypassing of the cells coupled to said other ones of the terminals in the scan chain and supplying the successive signals asynchronously from a clock for serial transport through the shift register structure.

* * * * *